(12) United States Patent
Götz et al.

(10) Patent No.: US 6,549,080 B2
(45) Date of Patent: Apr. 15, 2003

(54) ELECTRONIC CIRCUIT, PARTICULARLY FOR A MOBILE TRANSCEIVER

(75) Inventors: Edmund Götz, Dachau (DE); Markus Scholz, München (DE); Shen Feng, San Diego, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/054,614

(22) Filed: Jan. 22, 2002

(65) Prior Publication Data

US 2002/0118070 A1 Aug. 29, 2002

Related U.S. Application Data

(63) Continuation of application No. PCT/DE00/02323, filed on Jul. 18, 2000.

(30) Foreign Application Priority Data

Jul. 19, 1999 (DE) .......................... 199 33 799

(51) Int. Cl.$^7$ .......................... H03L 7/00; H03L 7/085
(52) U.S. Cl. .............. 331/17; 331/8; 331/25; 331/34; 327/156; 327/157; 455/260
(58) Field of Search .............. 331/1 A, 8, 14, 331/16, 17, 25, 34, 57, DIG. 2; 327/156–159; 332/127; 360/51; 375/376; 455/260

(56) References Cited

U.S. PATENT DOCUMENTS

| 4,598,217 A | 7/1986 | Predina et al. |
| 5,623,523 A | 4/1997 | Gehrke |
| 6,404,294 B1 * | 6/2002 | Sha et al. ............... 331/57 |

FOREIGN PATENT DOCUMENTS

EP 0 905 598 A1 3/1999

OTHER PUBLICATIONS

Japanese Patent Abstract No. 05199101 (Yoji), dated Aug. 6, 1993.

Japanese Patent Abstract No. 08162951 (Masashi), dated Jun. 21, 1996.

* cited by examiner

*Primary Examiner*—David C. Mis
(74) *Attorney, Agent, or Firm*—Laurence A. Greenberg; Werner H. Stemer; Gregory L. Mayback

(57) ABSTRACT

A phase-locked loop circuit is described and has a digital circuit section and an analog circuit section that are fed with different supply voltages. Control signals generated by the digital circuit section are conducted to the analog circuit section via level converters and therefore can control functions in the analog circuit section.

8 Claims, 6 Drawing Sheets

ELECTRONIC CIRCUIT, PARTICULARLY FOR A MOBILE TRANSCEIVER

CROSS-REFERENCE TO RELATED APPLICATION

This application is a continuation of copending International Application No. PCT/DE00/02323, filed Jul. 18, 2000, which designated the United States.

BACKGROUND OF THE INVENTION

FIELD OF THE INVENTION

The invention relates to an electronic circuit, particularly for and in a mobile transceiver, which has a digital circuit section and an analog circuit section connected to the digital circuit section.

It is known to use in radio frequency transmitting and receiving circuits phase-locked loop (PLL) circuits which control the phase and, if necessary, also the frequency of the transmitter and/or receiver to a desired value. For this purpose, frequently a voltage-controlled oscillator (VCO) generating the transmitting or receiving carrier frequency is controlled to the nominal frequency by the voltage applied to it. To achieve a sufficiently large control range, a correspondingly high control voltage swing is desirable which needs a correspondingly high supply voltage. On the other hand, the remaining signal processing, for example in a mobile transceiver, largely takes place at a digital level. At this level, low supply voltages of, for example, 2.7 V are increasingly used for reducing the power dissipation, temperature generation and the like. In the radio-frequency section, however, such low supply voltages lead to only low controllability so that the tuning range is restricted.

In U.S. Pat. No. 4,598,217, a phase/frequency detector for a phase-locked loop is shown. A digital circuit section at the input end is coupled to an analog circuit section at the output end. The digital circuit section has a supply voltage of 5 V. The analog circuit section has another supply voltage. To convert the signals to be transferred from the digital circuit section to the analog circuit section, a level converter is provided. The level converter contains current sources and current balancing circuits.

In Patent Abstracts of Japan, Vol. 1996, Nr. 10, Oct. 31, 1996 (JP-A-08-162951), a phase-locked loop is shown in which a charge pump converts output signals of the phase comparator to the loop filter. In U.S. Pat. No. 5,623,523, a further phase-locked loop is shown in which digitally provided upward-and downward-pumping signals drive a charge pump that is driven by a voltage boost network that is supplied by another supply voltage. The charge pump controls a loop filter.

SUMMARY OF THE INVENTION

It is accordingly an object of the invention to provide an electronic circuit, particularly for a mobile transceiver, which overcomes the above-mentioned disadvantages of the prior art devices of this general type, which is distinguished by good operability of the digital and analog circuit section.

With the foregoing and other objects in view there is provided, in accordance with the invention, an electronic circuit. The electronic circuit contains a digital circuit section outputting an activation signal, and the digital circuit section has a selection device for generating selection signals. An analog circuit section is connected to the digital circuit section and receives control signals, including the activation signal and the selection signals, from the digital circuit section. The analog circuit section contains a common output, and at least two controlled current source circuits having inputs, current outputs connected to one another at the common output, logic elements connected to the inputs, and level converters connected to the logic elements. The selection device of the digital circuit section generates the selection signals for selecting at least one of the controlled current source circuit to be activated. The selection signals are received at the inputs of the controlled current source circuits and are transmitted to the logic elements followed by the level converters for generating switching signals for controlling the current outputs of respective ones of the controlled current source circuits. A reference current generator is connected to the controlled current source circuit. The reference current generator receives and is controlled by the activation signal output by the digital circuit section. The reference current generator has an input receiving the activation signal, a further level converter coupled to the input, and at least two reference current branches coupled to the further level converter. The reference current generator converts the activation signal using the further level converter and generates, by use of the at least two reference current branches, reference currents fed to the controlled current source circuits. A first voltage supply is connected to the digital circuit section and supplies a first voltage. A second voltage supply is connected to the analog circuit section and supplies a second voltage being set to a higher potential level than the first voltage.

In the invention, different supply voltages are provided for the digital circuit section and the analog circuit section so that advantageous supply voltage levels can be separately preset, for example 2.7 to 3 V for the digital circuit section and 5 V for the analog circuit section. Since the amplitudes of the control signals fed from the digital circuit section to the analog circuit section can only be varied within the extent of their supply voltage, level converters which transform the control signal voltage level to the control level needed by the other circuit section are preferably provided at the input or output of the digital and/or analog circuit section.

In an advantageous embodiment, the analog circuit section contains a controlled current source circuit preceded by a reference current generator that can be switched on and off by an activation signal supplied by the digital circuit section. The activation signal is transformed to a higher level range of the voltage supply of the analog circuit section by a level converter. The output of the current source circuit is preferably connected to a control voltage generating unit for generating the control voltage for the frequency control of a voltage-controlled oscillator which is to be controlled locked in frequency and/or phase. The control of the voltage-controlled oscillator can thus be operated with the higher level swing of the voltage supply of the analog circuit section and in consequence a wide control range can be obtained. The control voltage generating device is preferably a loop filter with a capacitance to be charged and discharged in accordance with the desired control voltage value. The phase comparator or phase/frequency detector comparing the oscillator output signal with a predetermined reference signal is then preferably a component of the digital circuit section.

The control voltage inputs of the controllable current source circuit are preceded by level converters so that the control signals supplied from the digital circuit section are transformed to the higher voltage level range of the current source circuit.

The analog circuit section contains a number of selectively selectable controllable current source circuits that are connected to a common current output terminal. In this configuration, the current source circuits can be selected by one or more selection signals so that the current intensity in each case currently fed to the current output terminal is selectable.

The reference current generator contains a number of reference current branches by which reference currents can be fed to the individual current source circuits. The level converter disposed before the reference current generator is thus utilized several times, since a single level converter is used for controlling the activation of a number of reference current branches. This reduces the necessary circuit expenditure in spite of the possibility that is offered of being able to feed a number of current source circuits at the same time.

All reference current branches can be switched on and off by one or two electronic switches connected to the level converter so that the circuit expenditure needed overall for this is low.

The level converters preferably contain an input branch which is connected to the lower supply voltage and the output potential of which is switched over by the control switching signal supplied at the input from the digital circuit section. This input branch is connected to a conversion branch connected to a high supply voltage so that the switching signal level is switched between the ground potential, which is common to the two branches, and the high voltage potential.

The circuit according to the invention is used, in particular, in hybrid (analog and digital) phase and/or frequency controllers for radio-frequency oscillators, preferably in mobile transceivers, but can also be used in other systems, achieving the advantages listed above.

In accordance with an added feature of the invention, the level converters and/or the further level converter transforms to a higher level one or more of the signals generated by the digital circuit section.

In accordance with an additional feature of the invention, a control voltage generating device is connected to the common output. The digital circuit section has a detector being either a phase detector or a phase/frequency detector. The control voltage generating device is a loop filter used for generating a control voltage for a voltage-controlled oscillator which is controlled to be at least one of phase-locked and frequency-locked and an output signal of which is fed to the detector contained in the digital circuit section.

In accordance with another feature of the invention, the further level converter has an output, and the reference current generator contains at least one electronic switch connected to the reference current branches for switching off all of the reference current branches at a same time. The electronic switch is connected to the output of the further level converter.

In accordance with a further feature of the invention, the level converters and/or the further level converter contains an input stage connected to the first voltage supply and receives the first voltage and one of the signals generated by the digital circuit section, and a conversion and output stage connected to the input stage. The conversion and output stage is connected to the second voltage supply and receives the second voltage. The conversion and output stage outputs an output voltage switched between a common ground and the second voltage in dependence on the one signal applied to the input stage. The input stage and the conversion and output stage are both connected to the common ground.

In accordance with a concomitant feature of the invention, the analog circuit section is a radio-frequency section and the electronic circuit is a phase-locked loop for a mobile transceiver.

Other features which are considered as characteristic for the invention are set forth in the appended claims.

Although the invention is illustrated and described herein as embodied in an electronic circuit, particularly for a mobile transceiver, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
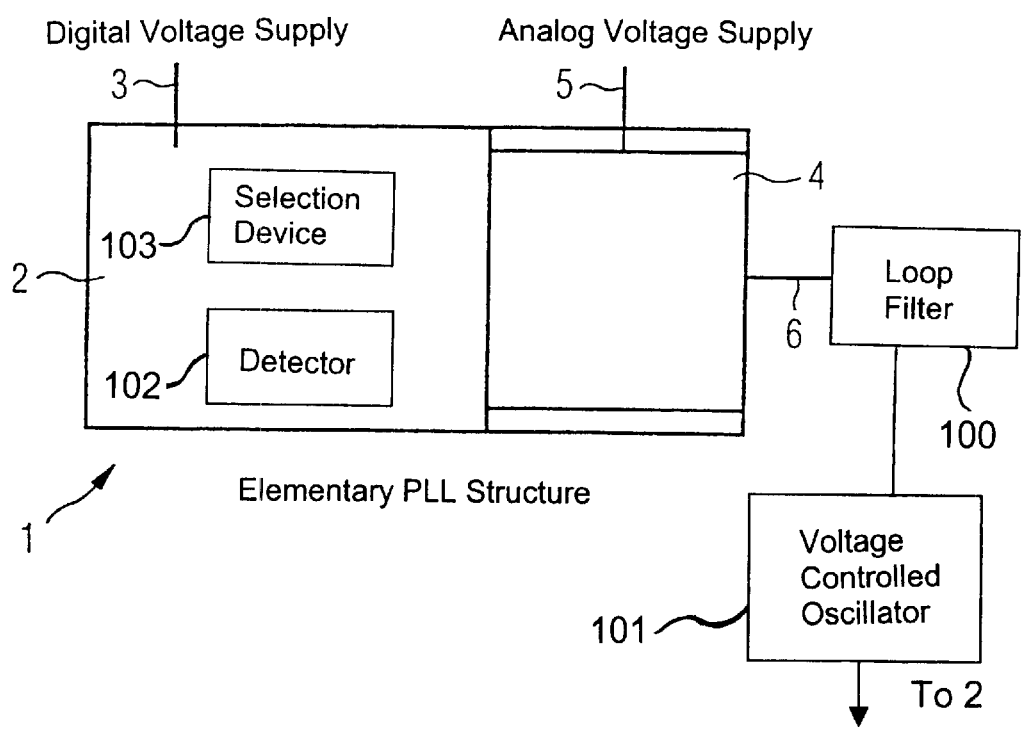
FIG. 1 is a diagrammatic block diagram of an exemplary embodiment in the form of a phase-locked loop according to the invention.

In all the figures of the drawing, sub-features and integral parts that correspond to one another bear the same reference symbol in each case. Referring now to the figures of the drawing in detail and first, particularly, to FIG. 1 thereof, there is shown a phase-locked loop 1 that contains a digital circuit section 2 with a voltage supply 3, and an analog circuit section 4 with a voltage supply 5. A supply potential of the analog voltage supply 5 is higher than that of the digital voltage supply 3, for example 5 V compared with 2.7 or 3 V. Here, the analog circuit section 4 is primarily formed by a current source configuration, an output 6 of which is connected to a control voltage generating device in a form of a loop filter 100 followed by a voltage-controlled oscillator 101 which generates a radio-frequency signal for the transmitting or receiving process and a phase and/or frequency of which is compared with a reference signal by a phase comparator or phase/frequency detector 102 contained in the digital circuit section 2. The output signal of the phase comparator or phase/frequency detector 102 is applied to the analog circuit section 4 for controlling the voltage-controlled oscillator with a wide control range and thus range of frequency adjustment.

Figure 2:
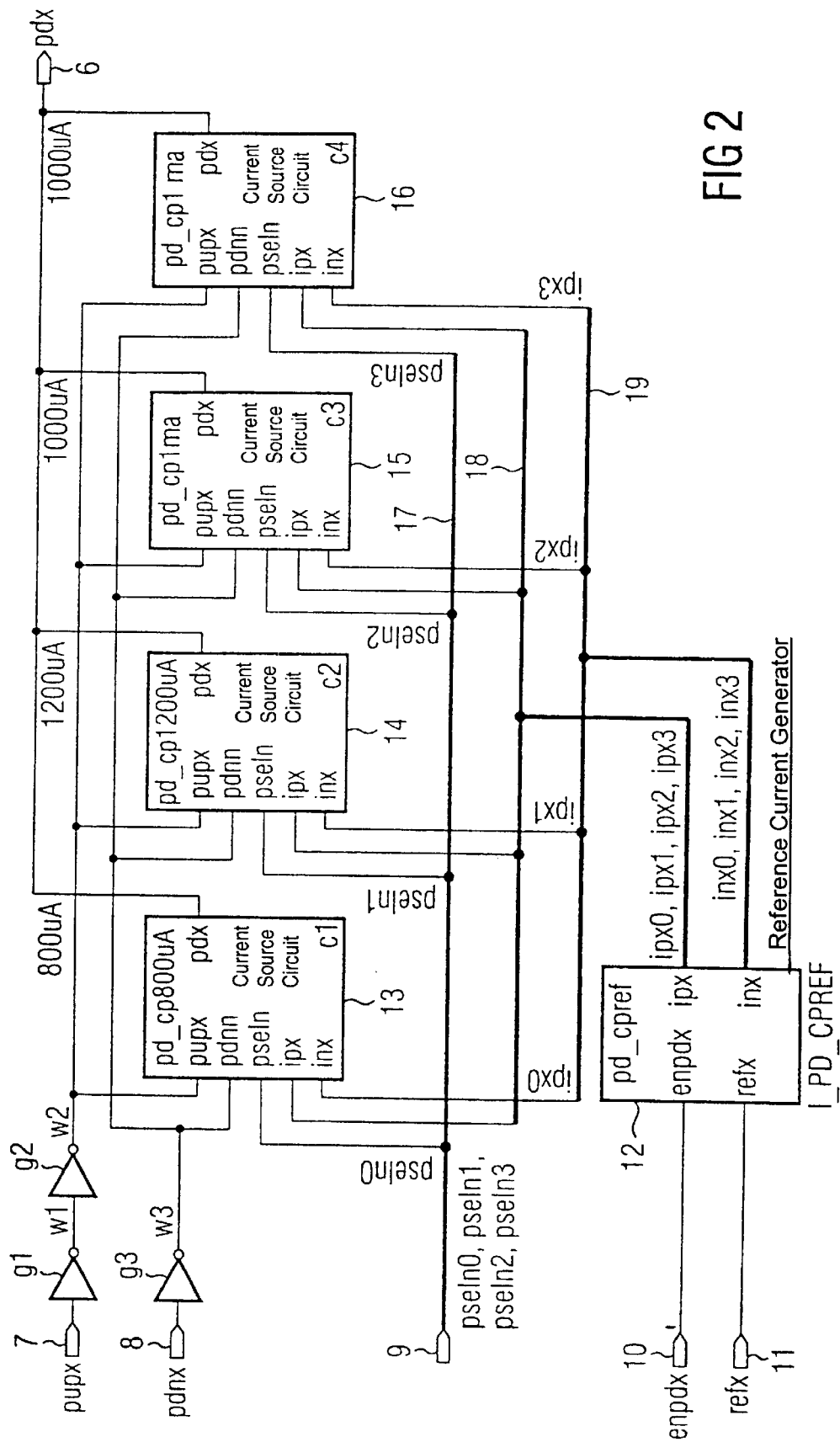
FIG. 2 is a block circuit diagram of a current source configuration in the phase-locked loop.

The current source configuration is shown in greater detail in FIG. 2 and contains five inputs 7 to 11 connected to the digital circuit section 2, a reference current generator 12 and four current source circuits 13 to 16 which are configured for different charging and discharging currents of in this case 800 µA, 1000 µA (twice) and 1200 µA, and current outputs of the current source circuits 13–16 are jointly connected to the output 6. The current source circuit(s) 13 to 16 are activated in each case by being selected via four selection lines 17, which are selectively connected to the current source circuits 13–16 and which are connected via four wires to the input 9 and are selected via the input 9 as required by a selection device 103 of the digital circuit section 2. Furthermore, the current source circuits 13 to 16 are in each case selectively connected to the reference voltage generator 12 via two reference current lines 18, 19, the line sections of the lines 17, 18, 19 shown wider in each case symbolizing lines with four wires.

Figure 3:
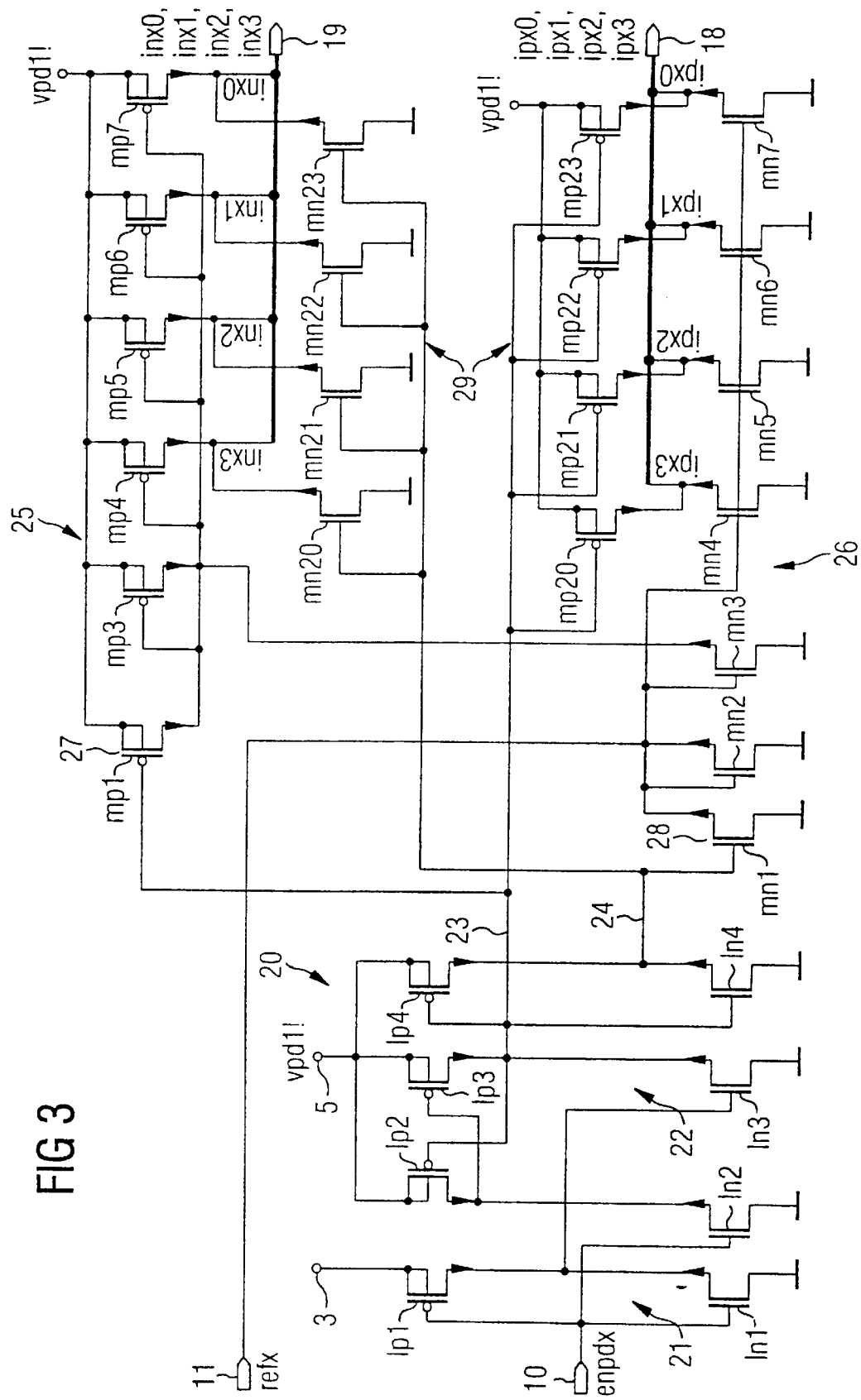
FIG. 3 is a circuit diagram of a reference current generator preceded by a level converter.

FIG. 3 shows the reference current generator 12 in greater detail. The reference current generator 12 contains a level converter 20 connected to the input 10, which converts an activation signal applied to the input 10, which is used for switching the reference current generator 12 on and off and the level of which changes between ground potential and the level of the positive supply voltage 3 of the digital circuit section 3, into a switching signal, the level of which changes between the ground potential and the higher level of the voltage supply 5 for the analog circuit section 4.

The level converter 20 contains an input stage 21 connected to the supply voltage 3, and a conversion and output stage 22 that is connected to the supply voltage 5. The ground potential for the input and conversion/output stage is in each case identical. The input stage 21 is connected via outputs, which are in each case connected to inverse potential (ground potential or high supply potential), to two parallel branches of the conversion/output stage 22 and in each case switches field effect transistors present there through to ground or into the cutoff state. At two complimentary outputs 23, 24 of the level converter 20, a switching signal is thus generated which changes between ground potential and the high potential value of the supply voltage 5.

The reference current generator 12 also contains a current balancing circuit 25 for generating four reference currents inx0, 1, 2, 3, which are fed via the lines 19 to the in each case associated controllable current source circuits 13 to 16, and a current balancing circuit 26 for generating four reference currents ipx0, 1, 2, 3 which are fed via the lines 18 to the current source circuits 13 to 16.

Via the terminal 11, the digital circuit section 2 impresses a reference current of, for example, 100 µA into the current balancing circuit 26. Due to the coupling shown between the current balancing circuits 25 and 26, the reference current is also impressed into the current balancing circuit 25 so that in each case identical, positive and negative currents are generated there for the respective current source circuits 13 to 16. At the input of the current balancing circuit 25, a switch 27 in the form of a field effect transistor 27 is disposed which is controlled by the output 23 of the level converter 20. Similarly, a switch 28 in the form of a field effect transistor 28, which is controlled by the output 24 of the level converter 20, is attached to the input of the current balancing circuit 26. If the activation signal present at input 10 signals the deactivation and has a low level, both switches 27 and 28 are switched through so that the current balancing circuits 25, 26 become inactive and no longer feed any reference currents to the current source circuits 13 to 16. The switching-off process is promoted by the switching-off transistors, collectively designated by 29, by which the individual current lines 18, 19 are switched over to the in each case opposite voltage potential. Since the reference current is impressed independently of the potential at the input 11, no level converter is required here, which reduces the circuit expenditure.

Figure 4:
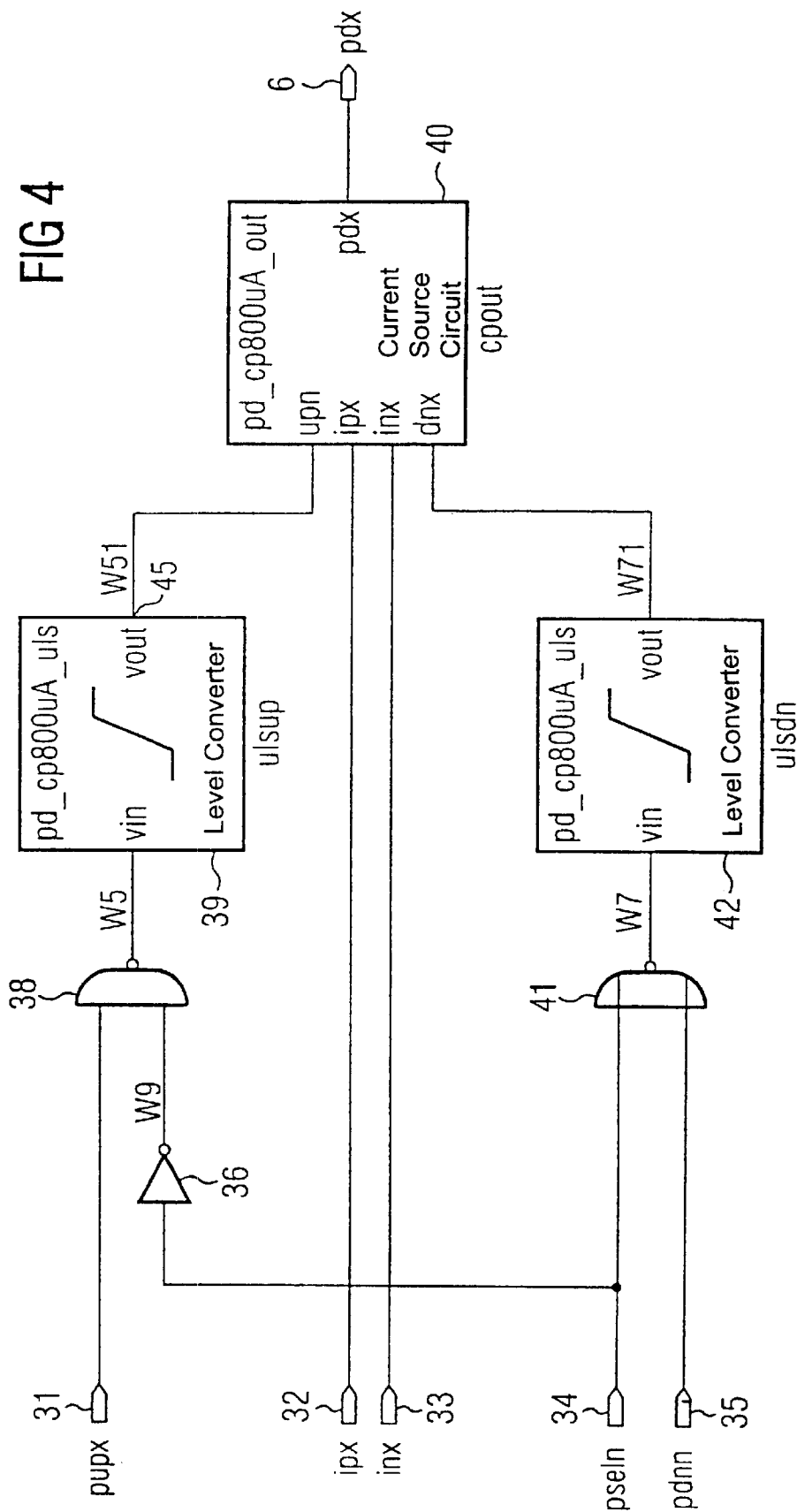
FIG. 4 is a block circuit diagram of a current source circuit preceded by level converters.
Figure 5:
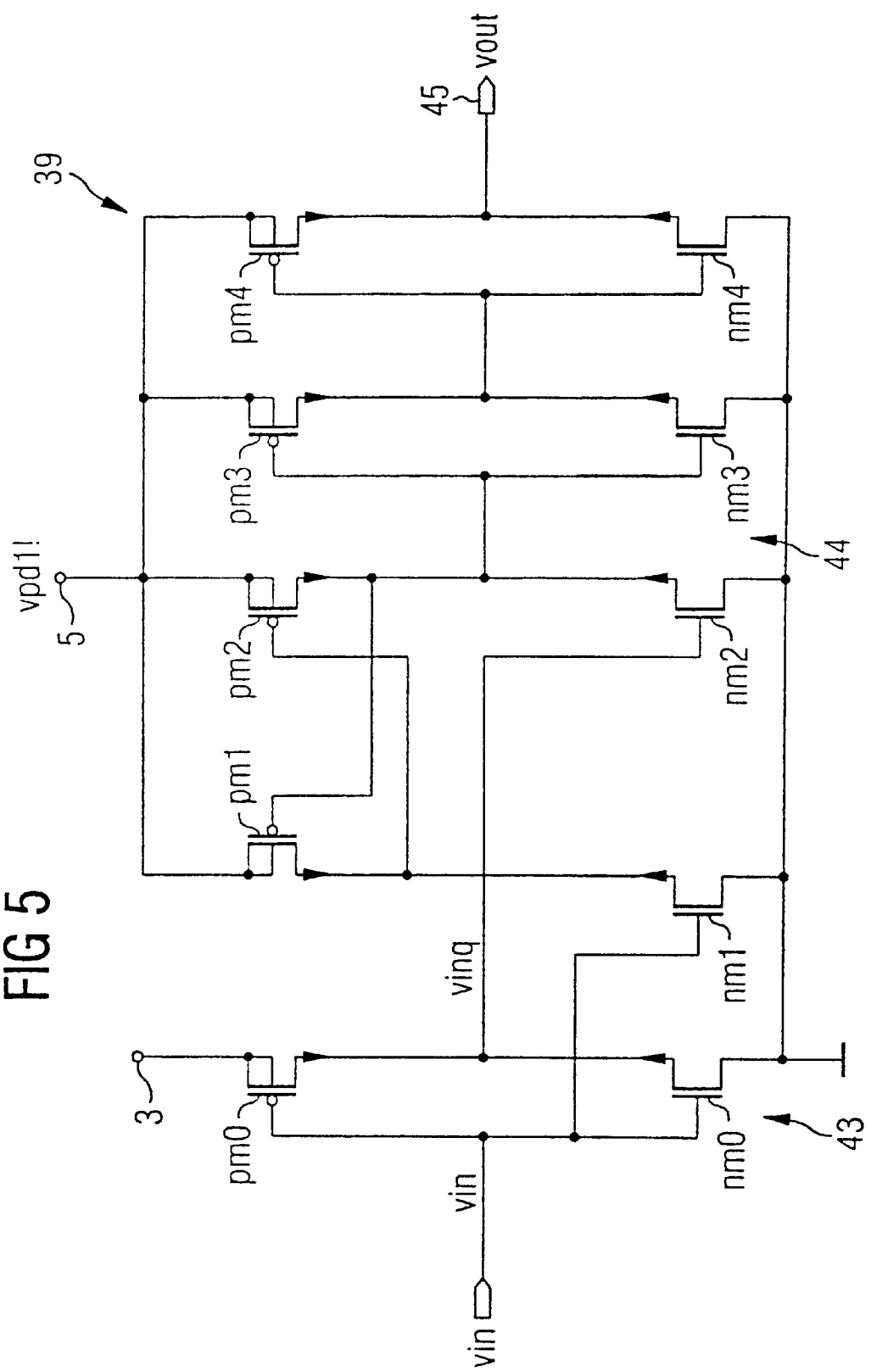
FIG. 5 is a circuit diagram of the level converter.

FIG. 4 shows the current source circuit 13 shown in FIG. 2 in greater detail. The configuration of the current source circuits 14, 15 and 16 are identical. The current source circuit 13 contains five inputs 31 to 35 which are connected to the terminals 7 to 9 or, respectively, to lines 18, 19 (terminals 32, 33) in the manner shown in FIG. 2. At the input 31, a control voltage is present for switching on and off an output stage, which is provided for the high-level end, of a current source circuit 40. Similarly, a control voltage, alternating between ground and the lower supply voltage 3, for switching the low-level output stage of the current source circuit 40 on and off is applied to the input 35. The input 31 is connected to a logic element 38 in the form of a NAND gate 38, to the other input of which the selection signal inverted via an inverter 36 is applied at terminal 34. The output signal of the logic element 38 is connected to a level converter 39, the circuit configuration of which is shown in FIG. 5 and which converts the low voltage excursion of the output signal of the logic element 38 (operated with the voltage supply 3) into the higher voltage level of the supply voltage 5. The output signal of the level converter 39 is applied to an input upn of the current source circuit 40.

The control signal applied to the input 35 is applied to a logic element 41 in the form of a NOR gate 41, at the other input of which the selection signal supplied at input 34 is present. The logic element 41 is followed by a level converter 42 that has the same configuration as the level converter 39 and transforms the input voltage to a higher voltage level. The output signal of the level converter 42 is applied to the input dnx of the current source circuit 40. The reference currents supplied or removed, respectively, via terminals 32, 33 are impressed into inputs ipx, inx of the current source circuit 40.

The logic elements 38, 41 can be activated or deactivated at the same time by the selection signal at the input 34 so that they are used as a closing switch and an opening switch. If no selection is present, the control signals present at the inputs 31, 35 are not applied to the level converter 39, 42 so that these and the current source circuit 40 are switched off, but the reference currents are still fed into the current source circuit 40. The latter can thus be activated immediately without transient effects when the current source circuit 13 is selected. Naturally, the same also applies to the other current source circuits 14, 15, 16.

The level converter 39 (or 42, respectively), shown in FIG. 5, similarly to the level converter 20 shown in FIG. 2, contains an input stage 43 to which the input signal vin switching between the lower potential values of the digital supply voltage 3 is applied. The input stage 43 is connected between the low supply voltage 3 and ground. As in the case of the level converter 20, the input stage 43 is connected to a conversion and output stage 44 which is connected between the high supply voltage 5 and ground and switches the output voltage output at an output terminal 45 between ground potential and the high supply voltage level at terminal 5, that is to say correspondingly increases the voltage swing or level.

Figure 6:
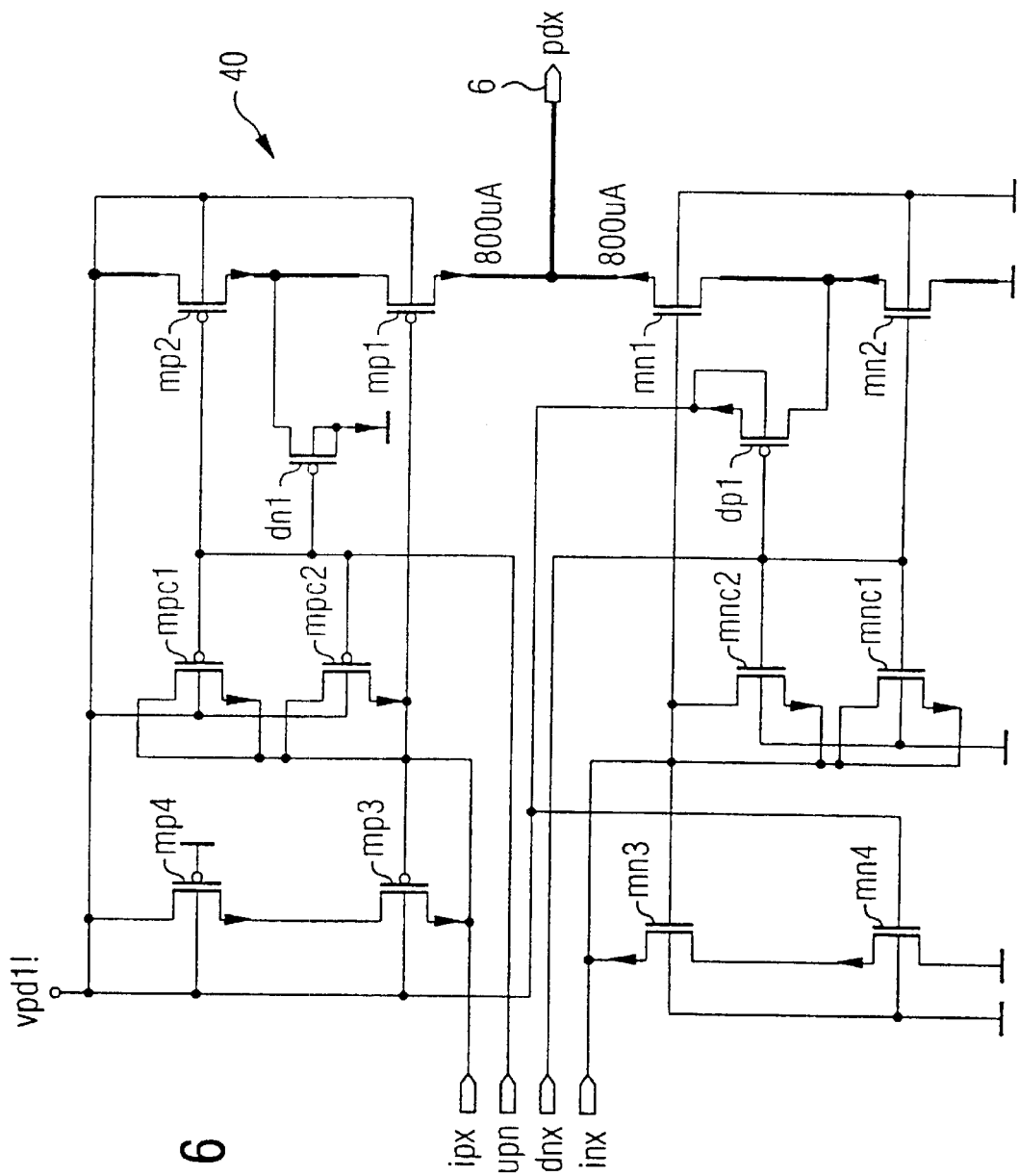
FIG. 6 is a circuit diagram of the current source circuit.

FIG. 6 shows the configuration of the current source circuit 40 in greater detail. The configuration is known per se from Published, European Patent Application EP 0 905 598 A1, particularly FIG. 2 and the associated description. The content of Published, European Patent Application EP 0 905 598 A1 is incorporated herein by reference to its full extent in the present application in order to avoid repetitions. The supply-voltage-independent current source circuit, which is dynamically compensated for a wide supply voltage range, is particularly suitable for use in the present invention in which different supply voltages are used.

We claim:

1. An electronic circuit, comprising:

a digital circuit section outputting an activation signal, said digital circuit section having a selection device for generating selection signals;

an analog circuit section connected to said digital circuit section and receiving control signals, including the activation signal and the selection signals, from said digital circuit section, said analog circuit section containing:

a common output;

at least two controlled current source circuits having inputs, current outputs connected to one another at said common output, logic elements connected to said inputs, and level converters connected to said logic elements, said selection device of said digital circuit section generating the selection signals for selecting at least one of said controlled current source circuit to be activated, the selection signals received at said inputs of said controlled current source circuits being transmitted to said logic elements followed by said level converters for generating switching signals for controlling said current outputs of respective ones of said controlled current source circuits; and a reference current generator connected to said controlled current source circuits, said reference current generator receiving and controlled by the activation signal received from said digital circuit section, said reference current generator having an input receiving the activation signal, a further level converter coupled to said input, and at least two reference current branches coupled to said further level converter, said reference current generator converts the activation signal using said further level converter and generates, by use of said at least two reference current branches, reference currents fed to said controlled current source circuits;

a first voltage supply connected to said digital circuit section and supplying a first voltage; and a second voltage supply connected to said analog circuit section and supplying a second voltage being set to a higher potential level than said first voltage.

2. The circuit according to claim 1, wherein at least one of said level converters and said further level converter transforms to a higher level one or more of the signals generated by said digital circuit section.

3. The circuit according to claim 1, including a control voltage generating device connected to said common output.

4. The circuit according to claim 3, wherein:

said digital circuit section has a detector selected from group consisting of a phase detector and a phase/frequency detector; and said control voltage generating device is a loop filter used for generating a control voltage for a voltage-controlled oscillator which is controlled to be at least one of phase-locked and frequency-locked and an output signal of which is fed to said detector contained in said digital circuit section.

5. The circuit according to claim 1, wherein:

said further level converter has an output; and said reference current generator contains at least one electronic switch connected to said reference current branches for switching off all of said reference current branches at a same time, said electronic switch connected to said output of said further level converter.

6. The circuit according to claim 1, wherein at least one of said level converters and said further level converter contains an input stage connected to said first voltage supply and receiving the first voltage and one of the signals generated by said digital circuit section, and a conversion and output stage connected to said input stage, said conversion and output stage connected to said second voltage supply and receiving the second voltage, said conversion and output stage outputting an output voltage switched between a common ground and the second voltage in dependence on the one signal applied to said input stage, said input stage and said conversion and output stage both being connected to the common ground.

7. The circuit according to claim 1, wherein said analog circuit section is a radio-frequency section.

8. The circuit according to claim 1, wherein the electronic circuit is a phase-locked loop for a mobile transceiver.

* * * * *